United States Patent
Wu et al.

(10) Patent No.: US 11,088,677 B1
(45) Date of Patent: Aug. 10, 2021

(54) SIGNAL RECEIVING DEVICE

(71) Applicant: Winbond Electronics Corp., Taichung (TW)

(72) Inventors: Chen-Yu Wu, Taichung (TW); Chun-Cheng Chen, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/105,662

(22) Filed: Nov. 27, 2020

(51) Int. Cl.
*H03K 3/017* (2006.01)
*H03K 3/0233* (2006.01)
*H03G 3/00* (2006.01)
*H03F 3/45* (2006.01)

(52) U.S. Cl.
CPC .............. *H03K 3/017* (2013.01); *H03F 3/45* (2013.01); *H03G 3/008* (2013.01); *H03K 3/0233* (2013.01)

(58) Field of Classification Search
CPC .... H03K 3/017; H03K 3/0233; H03K 5/2445; H03K 5/2481; G11C 7/062; G11C 7/06; G01R 19/0038; H03F 3/45; H03F 3/45071; H03F 3/45179; H03G 1/0017; H03G 3/008; H03G 3/00; H03G 2201/103

See application file for complete search history.

(56) References Cited

U.S. PATENT DOCUMENTS

| | | | |
|---|---|---|---|
| 6,265,941 B1 * | 7/2001 | Lopata | H03F 3/3023 330/258 |
| 8,471,539 B2 | 6/2013 | Wu | |
| 9,698,735 B1 | 7/2017 | McCue et al. | |
| 9,742,366 B2 | 8/2017 | Galal | |
| 9,780,763 B1 | 10/2017 | Lu et al. | |
| 10,205,445 B1 | 2/2019 | Kansal et al. | |
| 10,461,701 B2 | 10/2019 | Wu et al. | |
| 10,712,769 B2 | 7/2020 | Zhang et al. | |

FOREIGN PATENT DOCUMENTS

TW I505645 10/2015
WO 2019089394 5/2019

* cited by examiner

*Primary Examiner* — Jung Kim
(74) *Attorney, Agent, or Firm* — JCIPRNET

(57) ABSTRACT

A signal receiving device includes a first amplifier, a duty cycle adjuster and a common mode feedback circuit. The first amplifier receives an input signal, a reference voltage and a bias voltage. The first amplifier generates a first common current based on the bias voltage and, based on the first common current, generates a first output signal and a second output signal complementary to each other by comparing the input signal and the reference voltage. The duty cycle adjuster charges and discharges a selected capacitor according to the first output signal or the second output signal to generate a sensing voltage, and generates a common reference voltage according to the sensing voltage. The common mode feedback circuit generates the bias voltage by comparing the common reference voltage and the reference voltage.

10 Claims, 4 Drawing Sheets

SIGNAL RECEIVING DEVICE

BACKGROUND

1. Technical Field

The disclosure relates to a signal receiving device, and particularly relates to a signal receiving device capable of adjusting the duty cycle of an output signal.

2. Description of Related Art

In the conventional technical field, a preamplifier in the signal receiver is often implemented by a differential amplifier. The differential amplifier operates on a common current, and the voltage value of the output signal may be determined according to the magnitude of the current flowing through the differential transistor.

In the conventional technical field, because the magnitude of the common current is fixed, when the turn-on voltage of a differential transistor changes due to process drift or environmental factors, the transconductance value of the differential transistor changes correspondingly. Such a change may cause the duty cycle of the output signal generated by the differential amplifier to be unable to maintain in the correct range, resulting in distortion of the received signal.

SUMMARY

The disclosure provides a signal receiving device capable of dynamically adjusting the duty cycle of an output signal.

A signal receiving device of the disclosure includes a first amplifier, a duty cycle adjuster and a common mode feedback circuit. The first amplifier receives an input signal, a reference voltage and a bias voltage. The first amplifier generates a first common current based on the bias voltage and, based on the first common current, generates a first output signal and a second output signal complementary to each other by comparing the input signal and the reference voltage. The duty cycle adjuster receives the first output signal and the second output signal, charges and discharges a selected capacitor according to the first output signal or the second output signal to generate a sensing voltage, and generates a common reference voltage according to the sensing voltage. The common mode feedback circuit receives the common reference voltage and generates the bias voltage by comparing the common reference voltage and the reference voltage.

Based on the above, the embodiments of the disclosure provide a duty cycle adjuster that detects the change of the duty cycle of the output signal of the amplifier and adjusts the bias voltage used by the amplifier to generate the common current according to the change of the duty cycle of the output signal. In this way, the distortion of the output signal of the amplifier due to change of the transconductance value can be compensated, and the correctness of the output signal can be maintained.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
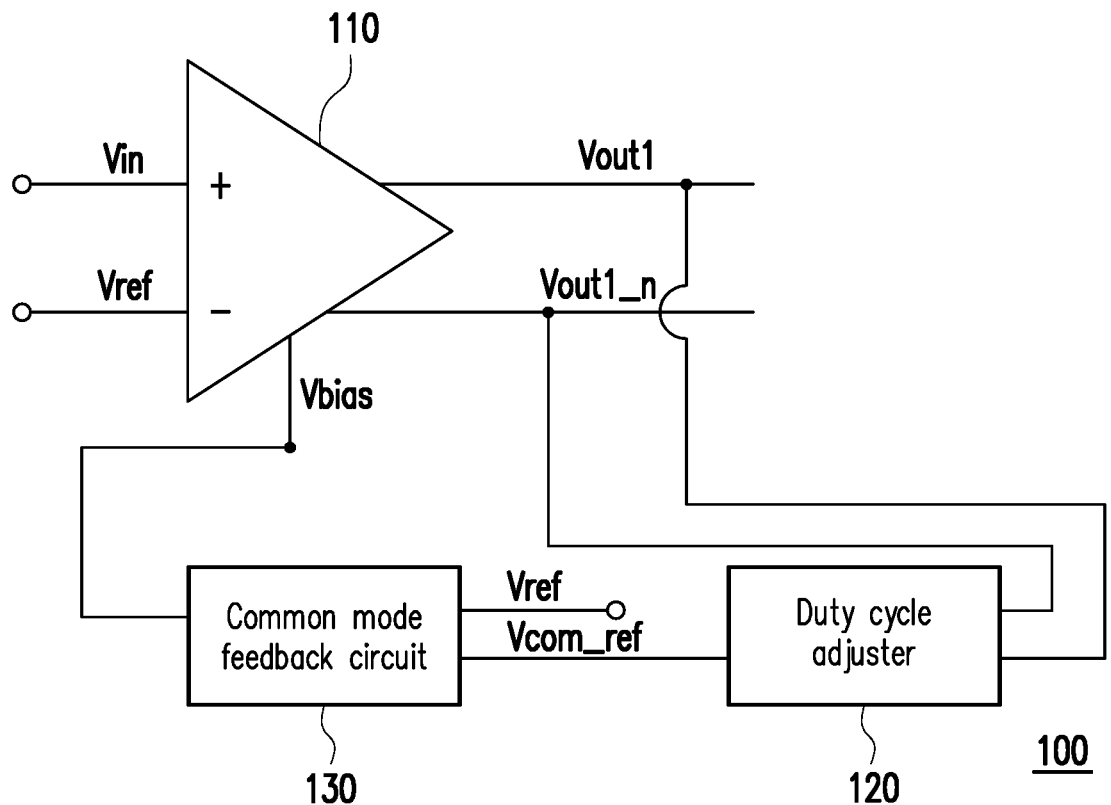
FIG. 1 is a schematic diagram of a signal receiving device according to an embodiment of the disclosure.

Reference will now be made in detail to the exemplary embodiments of the disclosure, examples of which are illustrated in the accompanying drawings. Wherever possible, the same reference numbers are used in the drawings and the description to refer to the same or like parts.

FIG. 1 is a schematic diagram of a signal receiving device according to an embodiment of the disclosure. A signal receiving device 100 includes an amplifier 110, a duty cycle adjuster 120, and a common mode feedback circuit 130. The amplifier 110 receives an input signal Vin, a reference voltage Vref, and a bias voltage Vbias. The amplifier 110 generates a common current based on the bias voltage Vbias, and, based on the common current, generates an output signal Vout1 and an output signal Vout1_$n$ complementary to each other by comparing the input signal Vin and the voltage Vref. The amplifier 110 may be a differential amplifier. The amplifier 110 may determine a common mode voltage level of the output signal Vout1 and the output signal Vout1_$n$ according to the common current generated by the bias voltage Vbias.

The duty cycle adjuster 120 is coupled to the amplifier 110. The duty cycle adjuster 120 receives the output signal Vout1 and the output signal Vout1_$n$ complementary to each other. The duty cycle adjuster 120 charges and discharges a selected capacitor according to the output signal Vout1 or the output signal Vout1_$n$ to generate a sensing voltage. The duty cycle adjuster 120 generates a common reference voltage Vcom_ref according to the sensing voltage.

In the present embodiment, the duty cycle adjuster 120 charges and discharges the selected capacitor according to one of the output signal Vout1 or the output signal Vout1_$n$ so as to sense a duty cycle of the output signal Vout1 and the output signal Vout1_$n$, and obtains the common reference voltage Vcom_ref according to the generated sensing voltage.

The common reference voltage Vcom_ref is provided to a common mode feedback circuit 130. The common mode feedback circuit 130 further receives the reference voltage Vref, and adjusts a voltage value of the bias voltage Vbias by comparing the common reference voltage Vcom_ref and the reference voltage Vref.

Based on the above, by adjusting the voltage value of the bias voltage Vbias, the common current in the amplifier 110 may be adjusted. In this way, when a turn-on voltage of the differential transistor in the amplifier 110 changes, the transconductance value of the differential transistor may be automatically adjusted by adjusting the magnitude of the current flowing in the differential transistor so as to maintain the duty cycle of the output signal Vout1 and output signal Vout1_$n$.

Figure 2:
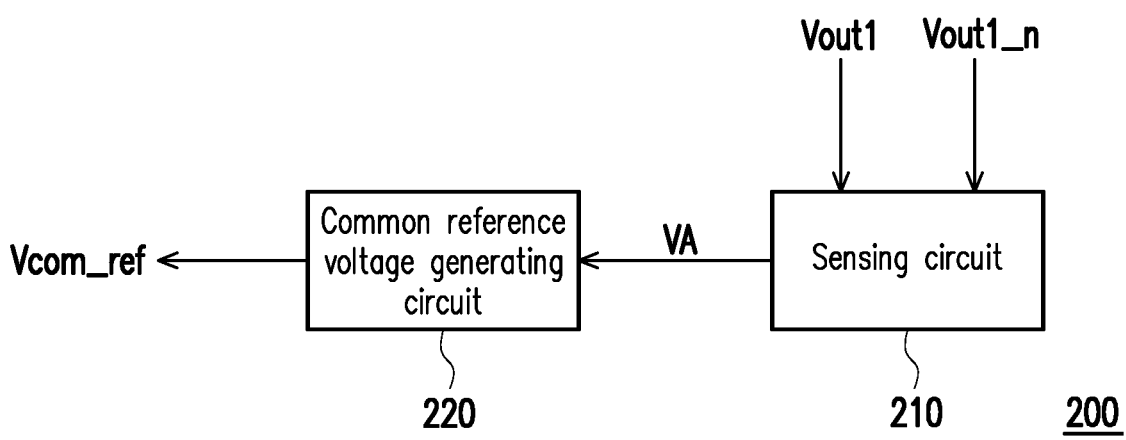
FIG. 2 is a schematic diagram of an implementation of a duty cycle adjuster according to an embodiment of the disclosure.

FIG. 2 is a schematic diagram of an implementation of a duty cycle adjuster according to an embodiment of the disclosure. A duty cycle adjuster 200 includes a sensing circuit 210 and a common reference voltage generating circuit 220. The sensing circuit 210 receives the output signal Vout1 and the output signal Vout1_n. A selected capacitor may be configured in the sensing circuit 210, and the selected capacitor may be charged and discharged according to the output signal Vout1 or the output signal Vout1_n to generate a sensing voltage VA. The sensing circuit 210 provides the sensing voltage VA to the common reference voltage generating circuit 220. The common reference voltage generating circuit 220 provides multiple threshold voltages and compares the sensing voltage VA with the multiple threshold voltages, thereby generating multiple comparing results. The common reference voltage generating circuit 220 adjusts a voltage value of the common reference voltage Vcom_ref according to the obtained comparing results.

Figure 3:
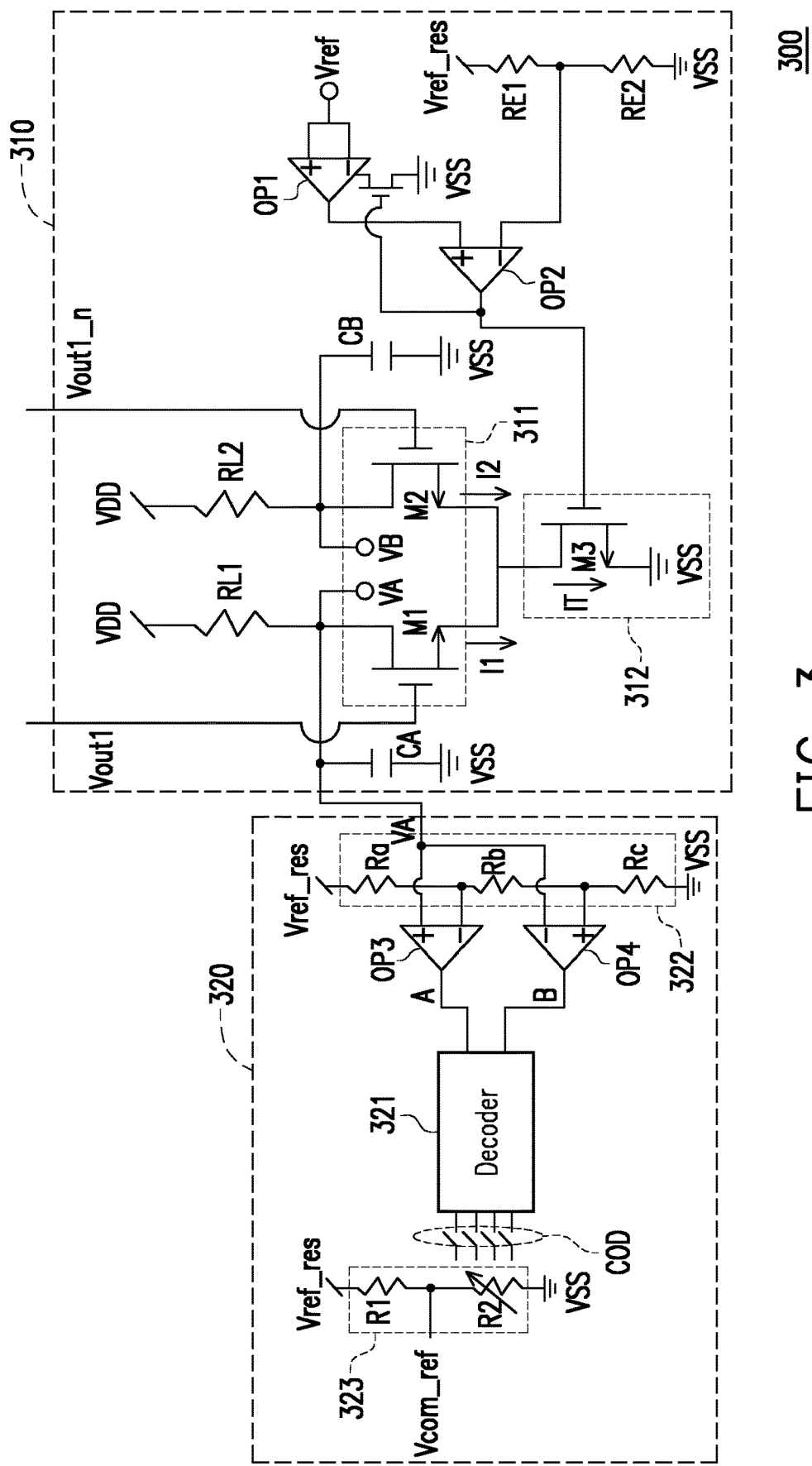
FIG. 3 is a circuit diagram of another implementation of the duty cycle adjuster according to an embodiment of the disclosure.

FIG. 3 discloses the circuit diagram of the duty cycle adjuster according to an embodiment of the disclosure. A duty cycle adjuster 300 includes a sensing circuit 310 and a common reference voltage generating circuit 320. In the present embodiment, the sensing circuit 310 includes a differential pair 311, a current source 312, a load RL1, a load RL2, a capacitor CA, a capacitor CB, an operational amplifier OP1, an operational amplifier OP2, a resistor RE1, and a resistor RE2. The differential pair 311 is made up of a transistor M1 and a transistor M2. The load RL1 and the load RL2 are respectively coupled to a first terminal of the transistor M1 and a first terminal of the transistor M2, and the load RL1 and the load RL2 are jointly coupled to a reference power terminal VDD. The first terminal of the transistor M1 and the first terminal of the transistor M2 respectively form two load terminals of the differential pair 311. A control terminal of the transistor M1 and a control terminal of the transistor M2 respectively form two input terminals of the differential pair 311, and respectively receive the output signal Vout1 and the output signal Vout1_n.

In addition, a second terminal of the transistor M1 and a second terminal of the transistor M2 are connected to each other to form a common terminal of the differential pair 311. The current source 312 is made up of a transistor M3. The transistor M3 is coupled between the common terminal of the differential pair 311 and a reference power terminal VSS, and a control terminal of the transistor M3 is coupled to the operational amplifier OP2.

The current source 312 provides a current IT as the common current of the differential pair 311. The transistor M1 and the transistor M2 respectively generate a current I1 and a current I2 according to the output signal Vout1 and the Vout1_n received, where the sum of the current I1 and the current I2 is equal to the current IT.

On the other hand, a capacitor CA is connected in series between the first terminal of the transistor M1 and the reference power terminal VSS, and a capacitor CB is connected in series between the first terminal of the transistor M2 and the reference power terminal VSS. The capacitor CA and the capacitor CB may be respectively charged and discharged according to the voltage values on the first terminals of the transistor M1 and the transistor M2, thereby generating the sensing voltage VA and a sensing voltage VB accordingly.

In the present embodiment, the capacitor CA is coupled to the common reference voltage generating circuit 320, therefore the capacitor CA may serve as the selected capacitor. In other embodiments of the disclosure, the capacitor CB may also be coupled to the common reference voltage generating circuit 320 and serve as the selected capacitor, with no specific limitation.

In terms of operation details, since the output signal Vout1 is a signal that repeatedly transitions between a first voltage and a second voltage (for example, the first voltage is larger than the second voltage), when the output signal Vout1 is equal to the relatively large first voltage, the current I1 flowing in the load RL1 increases, causing the sensing voltage VA to decrease. When the output signal Vout1 is equal to the relatively small second voltage, the current I1 flowing in the load RL1 decreases, causing the sensing voltage VA to increase. Therefore, a duty cycle of the output signal Vout1 may be inversely proportional to a voltage value of the sensing voltage VA. As a result, according to the change of the voltage value of the sensing voltage VA, the change of the duty cycle of the output signal Vout1 may be obtained.

Incidentally, in the present embodiment, the operational amplifier OP1 and the operational amplifier OP2 are configured to generate a bias voltage received by the current source 312. The operational amplifier OP1 receives the reference voltage Vref, and an output terminal of the operational amplifier OP1 is coupled to a positive input terminal of the operational amplifier OP2. A negative input terminal of the operational amplifier OP2 is coupled to a resistor string formed by the resistor RE1 and the resistor RE2. The resistor RE1 and the resistor RE2 are coupled between a reference power terminal Vref_res and the reference power terminal VSS.

The common reference voltage generating circuit 320 includes a decoder 321, a threshold voltage generator 322, a voltage divider 323, a comparator OP3, and a comparator OP4. The decoder 321 is a digital-to-analog converter. The threshold voltage generator 322 is formed by multiple resistors Ra, Rb, and Rc. The resistor Ra, the resistor Rb, and the resistor Rc are sequentially coupled in series between the reference power terminal Vref_res and the reference power terminal VSS. The threshold voltage generator 322 divides the voltage of a reference power provided by the reference power terminal Vref_res through the resistor Ra, the resistor Rb, and the resistor Rc, thereby generating multiple threshold voltages. In the present embodiment, the threshold voltage generator 322 has three resistors Ra, Rb, and Rc, and may generate two threshold voltages.

The comparator OP3 and the comparator OP4 may be made up of operational amplifiers. A positive input terminal of the comparator OP3 receives the sensing voltage VA, and a negative input terminal of the comparator OP3 is coupled to a connection terminal of the resistor Ra and the resistor Rb and receives a first threshold voltage. A negative input terminal of comparator OP4 receives the sensing voltage VA, and a positive input terminal of comparator OP4 is coupled to the connection terminal of the resistor Rb and the resistor Re and receives a second threshold voltage, where the first threshold voltage is larger than the second threshold voltage.

The comparator OP3 and the comparator OP4 compare the sensing voltage VA with the first threshold voltage and the second threshold voltage, and respectively generate a comparing result A and a comparing result B. When the sensing voltage VA is larger than the first threshold voltage and larger than the second threshold voltage, the comparator OP3 and the comparator OP4 may respectively generate the comparing result A at a logic high level and the comparing result B at a logic low level. When the sensing voltage VA is smaller than the first threshold voltage but larger than the second threshold voltage, the comparator OP3 and the comparator OP4 may respectively generate the comparing result A at the logic low level and the comparing result B at the logic low level. When the sensing voltage VA is smaller than the first threshold voltage and smaller than the second threshold voltage, the comparator OP3 and the comparator OP4 may respectively generate the comparing result A at the logic low level and the comparing result B at the logic high level.

The decoder 321 receives the comparing result A and the comparing result B and decodes the comparing result A and the comparing result B, thereby generating an adjustment code COD. The voltage divider 323 includes a resistor R1 and a resistor R2. The resistor RE1 and the resistor RE2 are coupled between the reference power terminal Vref_res and the reference power terminal VSS. The resistor R1 and the resistor R2 divide the voltage of the reference power provided by the reference power terminal Vref_res, thereby generating the common reference voltage Vcom_ref. In the present embodiment, the resistor R2 is a variable resistor. A resistance of the resistor R2 may be determined according to the adjustment code COD. By increasing the resistance of the resistor R2, the voltage value of the common reference voltage Vcom_ref may be increased. On the other hand, by reducing the resistance of the resistor R2, the voltage value of the common reference voltage Vcom_ref may be decreased.

For the relationship between the adjustment of the common reference voltage Vcom_ref, the sensing voltage VA and the comparing results A and B in the present embodiment, see Table 1 below:

TABLE 1

| Duty cycle | Sensing voltage VA | Comparing result A | Comparing result B | Vcom_ref |
|---|---|---|---|---|
| 50% | 1 V | L | L | Maintain |
| 30% | 1.2 V | H | L | Decrease |
| 70% | 0.8 V | L | H | Increase |

In Table 1, L represents the logic low level, and H represents the logic high level. When the sensing voltage VA is 1V, the comparing result A and the comparing result B are both at logic low level (L); at this time, the duty cycle of the output signal Vout1 is 50%, and there is no need to adjust the voltage value of the common reference voltage Vcom_ref. When the sensing voltage VA is 1.2V, the comparing result A and the comparing result B are at logic high level (H) and logic low level (L) respectively; at this time, the duty cycle of the output signal Vout1 is 30%, and the voltage value of the common reference voltage Vcom_ref may be reduced to increase the duty cycle of the output signal Vout1. When the sensing voltage VA is 0.8V, the comparing result A and the comparing result B are at logic low level (L) and logic high level (H) respectively; at this time, the duty cycle of the output signal Vout1 is 70%, and the voltage value of the common reference voltage Vcom_ref may be increased to reduce the duty cycle of the output signal Vout1.

Incidentally, in the present embodiment, the resistor R1 may also be set as the variable resistor and made to receive the adjustment code COD to adjust the resistance provided so as to generate the common reference voltage Vcom_ref. With such a mechanism, under the condition that the voltage value of the common reference voltage Vcom_ref needs to be increased, the adjustment code COD generated by the decoder 321 needs to reduce the resistance of the resistor R1. In contrast, under the condition that the voltage value of the common reference voltage Vcom_ref needs to be reduced, the adjustment code COD generated by the decoder 321 needs to increase the resistance of the resistor R1.

Figure 4:
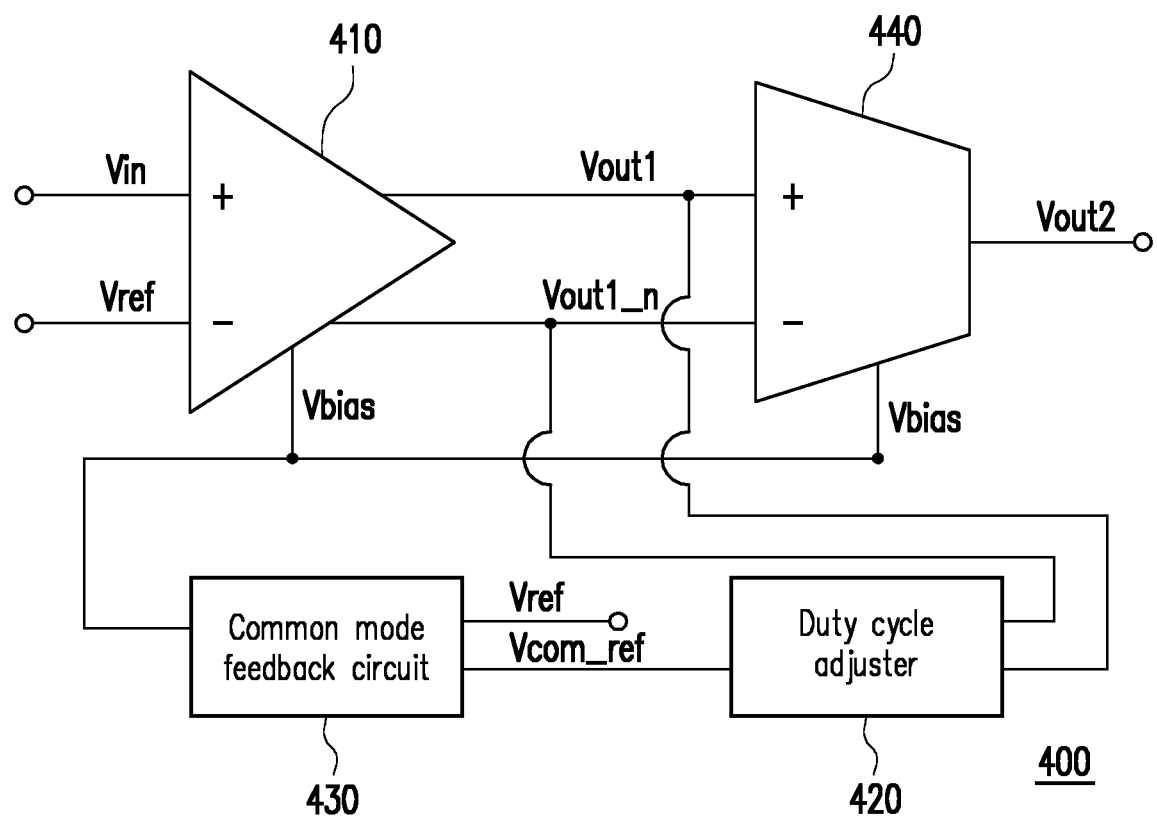
FIG. 4 is a schematic diagram of a signal receiving device according to another embodiment of the disclosure.

FIG. 4 is a schematic diagram of a signal receiving device according to another embodiment of the disclosure. A signal receiving device 400 includes an amplifier 410, an amplifier 440, a common mode feedback circuit 430, and a duty cycle adjuster 420. The amplifier 410 may serve as a preamplifier. The amplifier 410 receives the input signal Vin, the reference voltage Vref, and the bias voltage Vbias. The amplifier 410 generates a common current based on the bias voltage Vbias, and, based on the common current, generates the output signal Vout1 and the output signal Vout1_n complementary to each other by comparing to the input signal Vin and the voltage Vref. The amplifier 440 is coupled to an output terminal of the amplifier 410, receives the output signal Vout1 and the Vout1_n, and receives the bias voltage Vbias. The amplifier 440 generates the common current based on the bias voltage Vbias, and, based on the common current, generates a back-end stage output signal Vout2 according to the output signal Vout1 and the output signal Vout1_n.

The common mode feedback circuit 430 is coupled to the amplifier 410 and the amplifier 440, and generates the bias voltage Vbias according to the reference voltage Vref and the common reference voltage Vcom_ref. In the present embodiment, the common mode feedback circuit 430 may be implemented by any common mode feedback circuit (CMFB circuit) known to those with ordinary knowledge in the art, with no specific limitation.

The duty cycle adjuster 420 is coupled to the amplifier 410 and the common mode feedback circuit 430. The implementation details of the duty cycle adjuster 420 may be referred to in the implementations of the foregoing embodiments (such as the duty cycle adjuster 300 in FIG. 3), and are not repeated here.

Figure 5:
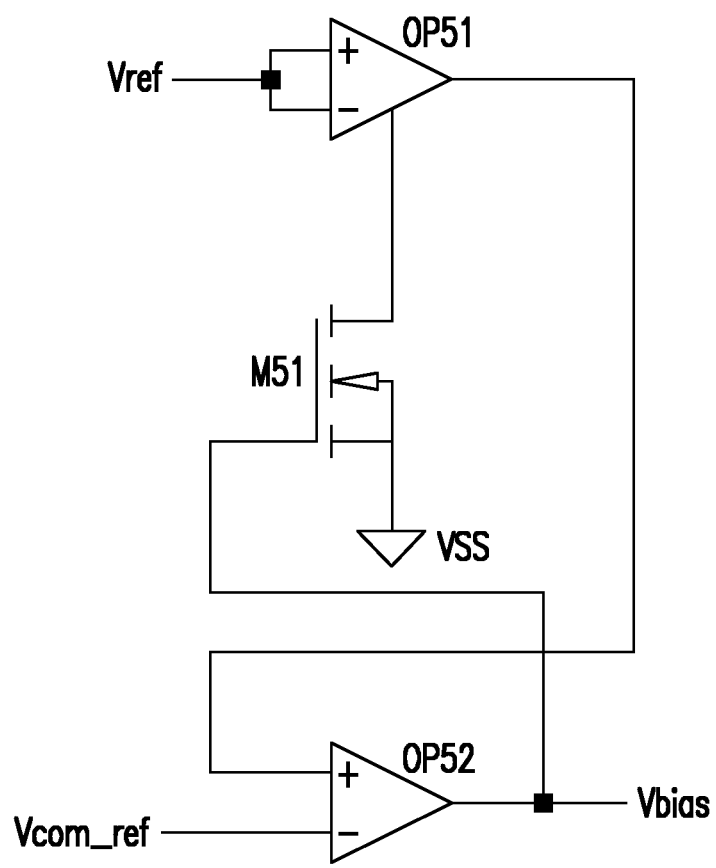
FIG. 5 is a circuit diagram of an implementation of a common mode feedback circuit according to an embodiment of the disclosure.

For the implementation details of the common mode feedback circuit, refer to the circuit diagram of the implementation of the common mode feedback circuit according to an embodiment of the disclosure shown in FIG. 5. In FIG. 5, a common mode feedback circuit 500 includes an amplifier OP51, an amplifier OP52, and a transistor M51. Two input terminals of the amplifier OP51 synchronously receive the reference voltage Vref, and an output terminal of the amplifier OP51 is coupled to a positive input terminal of the amplifier OP52. The transistor M51 serves as a current source of the amplifier OP51 and is coupled between the amplifier OP51 and the reference power terminal VSS. A negative input terminal of the amplifier OP52 receives the common reference voltage Vcom_ref to generate the bias voltage Vbias. In addition, the bias voltage Vbias is also provided to a gate terminal of the transistor M51.

It is worth mentioning that in the present embodiment of the disclosure, the circuit architecture of the amplifier OP51 may be the same as the circuit architectures of the amplifier 110 and the amplifier 410 in the embodiments shown in FIG. 1 and FIG. 4.

In summary, in the embodiments of the disclosure, the duty cycle of the output signal of the amplifier is sensed, and the voltage value of the common reference voltage is adjusted through the common mode feedback circuit, thereby compensating the variation generated by the turn-on voltage of the differential transistor of the amplifier and maintaining the duty cycle of the output signal in an effective range.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A signal receiving device, comprising:
   a first amplifier, receiving an input signal, a reference voltage and a bias voltage, the first amplifier generating a first common current based on the bias voltage and, based on the first common current, generating a first output signal and a second output signal complementary to each other by comparing the input signal and the reference voltage;
   a duty cycle adjuster, receiving the first output signal and the second output signal, charging and discharging a selected capacitor according to the first output signal or the second output signal to generate a sensing voltage, and generating a common reference voltage according to the sensing voltage; and
   a common mode feedback circuit, receiving the common reference voltage and generating the bias voltage by comparing the common reference voltage and the reference voltage.

2. The signal receiving device according to claim 1, wherein the duty cycle adjuster comprises:
   a sensing circuit, charging and discharging the selected capacitor according to the first output signal or the second output signal to generate the sensing voltage; and
   a common reference voltage generating circuit, providing a plurality of threshold voltages, comparing the sensing voltage with the threshold voltages to generate a plurality of comparing results, and adjusting the voltage value of the common reference voltage according to the comparing results.

3. The signal receiving device according to claim 2, wherein the sensing circuit comprises:
   a differential pair, having a common terminal to receive a first current, two input terminals of the differential pair respectively receiving the first output signal and the second output signal;
   a current source, coupled to the common terminal of the differential pair and coupled to a first reference power terminal, the current source providing the first current;
   a first load and a second load, respectively coupled to two load terminals of the differential pair, the first load and the second load jointly coupled to a second reference power terminal; and
   a first capacitor and a second capacitor, respectively coupled to the two load terminals of the differential pair and commonly coupled to the first reference power terminal.

4. The signal receiving device according to claim 3, wherein the first capacitor or the second capacitor is the selected capacitor.

5. The signal receiving device according to claim 2, wherein the sensing voltage is inversely proportional to a duty cycle of the first output signal or the second output signal.

6. The signal receiving device according to claim 2, wherein the common reference voltage generating circuit comprises:
   a threshold voltage generator, dividing the voltage of a first reference power to generate the threshold voltages;
   a plurality of comparators, respectively receiving the threshold voltages, each comparator comparing the sensing voltage and each of the threshold voltages to generate the comparing results; and
   a digital-to-analog converter, generating a plurality of adjustment codes based on the comparing results that are digital; and
   a voltage divider, having a first resistor and a second resistor coupled in series, the first resistor and the second resistor dividing the voltage of the first reference power to generate the common reference voltage, the first resistor or the second resistor being a variable resistor, and the adjustment codes configured to adjust a resistance of the variable resistor.

7. The signal receiving device according to claim 6, wherein the digital-to-analog converter is a decoder decoding the comparing results that are digital to generate the adjustment codes.

8. The signal receiving device according to claim 6, wherein when the threshold voltages are a first threshold voltage and a second threshold voltage, and when the sensing voltage is between the first threshold voltage and the second threshold voltage, the common reference voltage generating circuit does not adjust the voltage value of the common reference voltage; when the sensing voltage is larger than the first threshold voltage and larger than the second threshold voltage, the common reference voltage generating circuit reduces the voltage value of the common reference voltage; and when the sensing voltage is smaller than the first threshold voltage and smaller than the second threshold voltage, the common reference voltage generating circuit increases the voltage value of the common reference voltage.

9. The signal receiving device according to claim 6, wherein the threshold voltage generator comprises:
   a third resistor, a fourth resistor, and a fifth resistor, sequentially coupled in series between the first reference power and a second reference power, a coupling terminal of the third resistor and the fourth resistor providing a first threshold voltage, a coupling terminal of the fourth resistor and the fifth resistor providing a second threshold voltage.

10. The signal receiving device according to claim 1, further comprising:
    a second amplifier, receiving the first output signal, the second output signal, and the bias voltage, generating a second common current based on the bias voltage, and, based on the second common current, generating a back-end stage output signal according to the first output signal and the second output signal.

* * * * *